US012633369B2

(12) United States Patent
Hanyu et al.

(10) Patent No.: US 12,633,369 B2
(45) Date of Patent: May 19, 2026

(54) NON-VOLATILE MEMORY AND REWRITE CONTROL METHOD THEREOF

(71) Applicant: Renesas Electronics Corporation, Tokyo (JP)

(72) Inventors: Masami Hanyu, Tokyo (JP); Yoshihiro Nagai, Tokyo (JP); Hirofumi Ooga, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 18/783,136

(22) Filed: Jul. 24, 2024

(65) Prior Publication Data

US 2025/0037781 A1 Jan. 30, 2025

(30) Foreign Application Priority Data

Jul. 27, 2023 (JP) ................................ 2023-122335

(51) Int. Cl.
 *G11C 29/42* (2006.01)
 *G11C 29/26* (2006.01)

(52) U.S. Cl.
 CPC .............. *G11C 29/42* (2013.01); *G11C 29/26* (2013.01)

(58) Field of Classification Search
 None
 See application file for complete search history.

(56) References Cited

U.S. PATENT DOCUMENTS 7,305,596 B2 12/2007 Noda et al.

FOREIGN PATENT DOCUMENTS

JP 2006-48783 A 2/2006

*Primary Examiner* — Guerrier Merant
(74) *Attorney, Agent, or Firm* — Rimon P.C.

(57) ABSTRACT

The present invention provides a non-volatile memory system capable of suppressing excessive stress to normal cells and ensuring data retention margin of normal cells. In one embodiment of the non-volatile memory system, it determines whether or not error correction is possible for addresses judged to fail in the erase verify process, counts the number of addresses determined to be error-correctable, and if the number of such addresses is less than or equal to a predetermined number, the erase process is determined to be normal.

12 Claims, 9 Drawing Sheets

ION

DISTRIBUTION OF NORMAL CELLS
( PASS JUDGMENT TIME BY ECC )

ERASE VERIFY
THRESHOLD LEVEL

NO ABNORMAL CELLS

NUMBER OF
CELLS

NON-VOLATILE MEMORY AND REWRITE CONTROL METHOD THEREOF

CROSS-REFERENCE TO RELATED APPLICATIONS

The disclosure of Japanese Patent Application No. 2023-122335 filed on Jul. 27, 2023, including the specification, drawings and abstract is incorporated herein by reference in its entirety.

BACKGROUND

This disclosure relates to a non-volatile memory system and a rewrite control method for non-volatile memory.

In the rewrite process, i.e., the erase process and the write process of non-volatile memory, a verify process is performed to determine whether it has been correctly rewritten. In a normal verify process, if all the bits to be rewritten have been correctly rewritten, it is determined as a pass, and if there is even one bit of rewrite error, it is determined as a fail. Then, the rewrite process and the verify process are repeated until it is determined as a pass, and if it is determined as a fail even after repeating a certain number of times, it is finally determined as a fail.

There are disclosed techniques listed below.
[Patent Document 1] Japanese Unexamined Patent Application Publication No. 2006-048783

On the other hand, a non-volatile memory equipped with cells for an error correction code (ECC: Error Correction Code) to detect and correct error bits in addition to data cells is known. Patent Document 1 discloses a technology that allows a final pass determination even if it is determined as a fail in the verify process, as long as the number of error bits is n (n is a natural number) or less, which can be corrected by error correction. With such a configuration, the failure rate of non-volatile memory can be reduced.

SUMMARY

The inventors have identified the following problems with the technology disclosed in Patent Document 1. For example, in the method disclosed in FIG. 6 of Patent Document 1, it is determined whether the number of bits that can be error-corrected is n or less after repeating the rewriting process and the verification process the maximum number of times. In the erasure process, for example, if there are abnormal cells with small on-currents that deviate from the distribution of normal cells, the erasure process will be repeated due to these abnormal cells. As a result, there was a problem that excessive stress was applied to the normal cells. The details of the mechanism of occurrence of this problem will be explained in the specification as a comparative example.

On the other hand, in the method disclosed in FIG. 7 of Patent Document 1, for example, it is determined whether the number of bits that can be error-corrected is n or less every time the rewriting process and the verification process are performed once. In the erasure process, for example, if there are no abnormal cells, there is a risk that normal cells with on-currents that do not reach the threshold level of erasure verification may be allowed by error correction. In that case, there was a problem that the data retention margin was insufficient and the data retention time, i.e., the lifespan, was shortened. The details of the mechanism of occurrence of this problem will be explained in the specification as a comparative example. Other problems and novel features will become apparent from the description and accompanying drawings of this specification.

In a non-volatile memory system according to one embodiment, the controller determines whether an address determined to be a fail in the erase verification process can be error-corrected, counts the number of addresses determined to be error-correctable, and if the number of such addresses is less than or equal to a predetermined number, the erase process is determined to be normal.

In a method of rewriting control of non-volatile memory according to one embodiment, it is determined whether an address determined to be a fail in the erase verification process can be error-corrected, the number of addresses determined to be error-correctable is counted, and if the number of such addresses is less than or equal to a predetermined number, the erase process is determined to be normal.

According to the one embodiment, it is possible to provide a non-volatile memory system that can suppress excessive stress on normal cells and ensure the data retention margin of normal cells.

DETAILED DESCRIPTION

Figure 1:
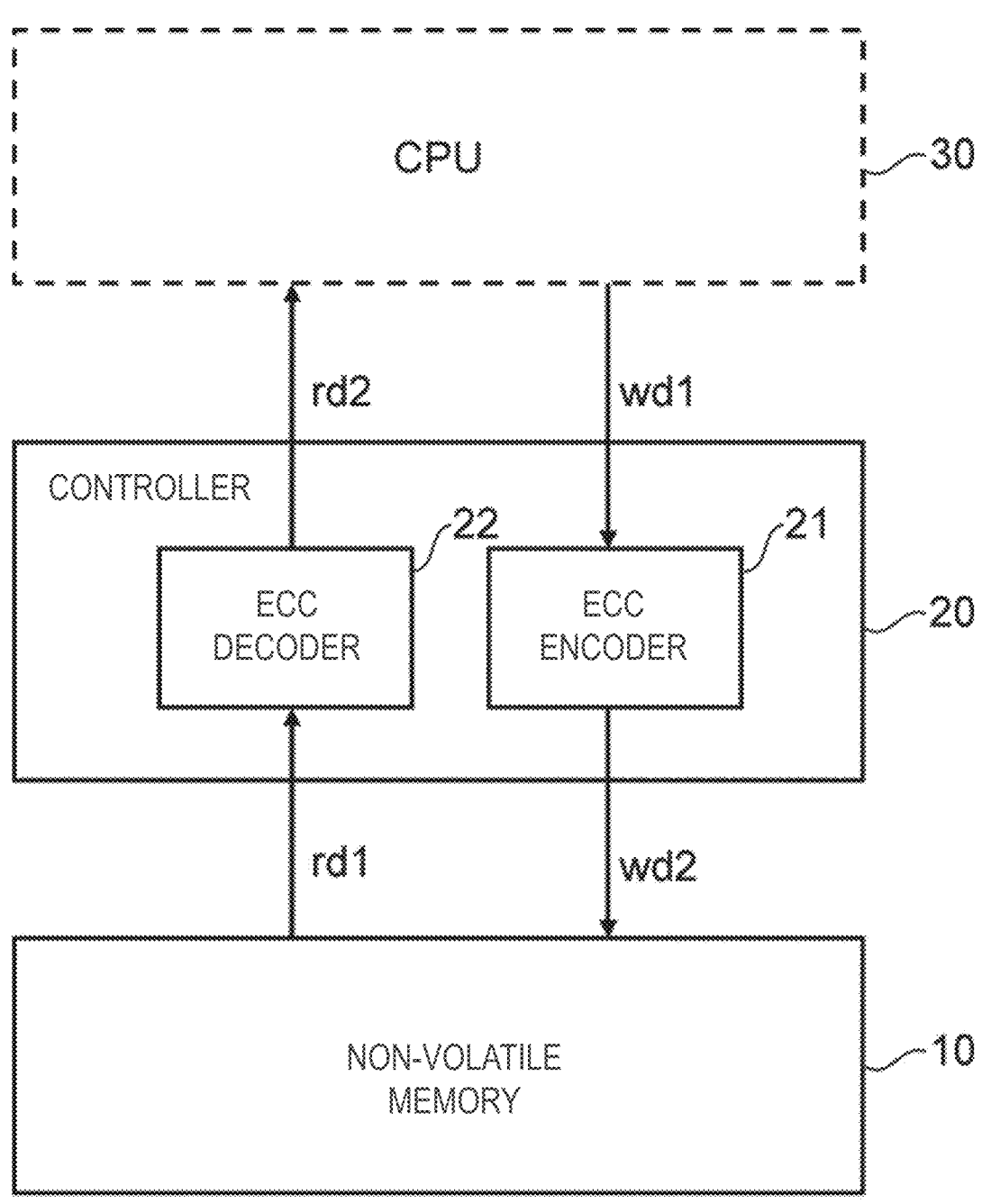
FIG. 1 is a block diagram showing the configuration of a non-volatile memory system according to a first embodiment.

Hereinafter, a specific embodiment of the present disclosure will be described in detail with reference to the drawings. However, the present disclosure is not limited to the following embodiments. For clarity of explanation, the following descriptions and drawings are appropriately simplified. Furthermore, in each drawing, the same elements are assigned the same reference numerals, and redundant explanations are omitted as necessary.

First Embodiment (Configuration of Non-Volatile Memory System)

First, referring to FIG. 1, a non-volatile memory system according to the first embodiment will be described. FIG. 1 is a block diagram showing the configuration of the non-volatile memory system according to the first embodiment. As shown in FIG. 1, the non-volatile memory system according to the first embodiment includes a non-volatile memory 10, a controller 20, and a CPU 30. In the non-volatile memory system according to this embodiment, the CPU 30 is not essential.

The non-volatile memory 10 is, for example, a flash memory, and includes a data cell and an error correction code (ECC: Error Correction Code) cell for each address. By providing an ECC cell, error correction can be performed for each address. The number of correctable bits n (n is a natural number) is determined as appropriate.

As an example, to enable 1-bit error correction per address, a 6-bit ECC cell is added to a 1-address (32-bit) data cell. To enable 2-bit error correction per address, a 12-bit ECC cell is added to the data cell.

The controller 20 performs a rewriting process, that is, an erasure process and a writing process, on the non-volatile memory 10. For example, when the non-volatile memory 10 is a flash memory, in the erasure process, all data cells are turned on and all data cell values are set to "1". The writing process is performed after the erasure process. In other words, to perform the writing process, the erasure process must be performed first. In the writing process, based on the write data, a predetermined data cell is switched from on to off, and the value of the data cell is switched from "1" to "0".

In the non-volatile memory 10, the erasure process is performed in bulk on a block or multiple blocks composed of multiple addresses. As an example, 256 addresses of 1 address (32 bits), that is, 1 KB, is set as 1 block. However, the capacity of one block is determined as appropriate.

The controller 20 shown in FIG. 1 includes an ECC encoder 21 and an ECC decoder 22. FIG. 1 shows the input and output of signals in the writing process. The ECC encoder 21 adds error correction data to the write data wd1 received from the CPU 30 and generates write data wd2. The controller 20 writes the write data wd2 with the added error correction data to the non-volatile memory 10. The ECC decoder 22 decodes the read data rd1 read from the non-volatile memory 10 and corrects the errors of the read data rd1. Then, the ECC decoder 22 outputs the error-corrected read data rd2 to the CPU 30.

Although not shown, in the case of the erasure process, the controller 20 turns on all data cells of the erasure target block in the non-volatile memory 10 and sets all data cell values to "1". Then, the ECC decoder 22 decodes the data read from the non-volatile memory 10 after the erasure process and corrects the errors of the data.

The controller 20 performs an erase verify process that determines whether the erase process has passed or failed for each address. For example, when the non-volatile memory 10 is a flash memory, the controller 20 reads data from the non-volatile memory 10 after performing the erasure process and determines whether all data cell values for each address are "1".

When all data cell values are "1", controller 20 determines a pass in the erase verify process. That is, controller 20 determines that the erase process is normal. On the other hand, if all data cell values are not "1" and include "0", controller 20 determines a fail in the erase verify process.

Furthermore, controller 20 determines whether or not error correction is possible for the address determined as a fail in the erase verify process. For example, if the erase verify process is performed on data that has been error-corrected by ECC decoder 22, it is determined that error correction is possible if it is a pass, and error correction is not possible if it is a fail.

Alternatively, the number of error bits included in the data read from the non-volatile memory 10 after the erase process may be counted, and if the number of error bits is less than or equal to the number of error-correctable bits n, it may be determined that error correction is possible. On the other hand, if the number of error bits exceeds the number of error-correctable bits n, it may be determined that error correction is not possible. That is, controller 20 does not necessarily have to have an ECC decoder 22 inside, and an ECC decoder 22 may be provided outside controller 20.

Then, controller 20 counts the number of addresses determined to be error-correctable, and if the number of such addresses is less than or equal to a predetermined number m (where m is a natural number), it determines that the erase process is normal. Here, the number m is appropriately determined based on, for example, the occurrence rate of abnormal cells with small on-currents that deviate from the distribution of normal cells. On the other hand, if the number of addresses exceeds the predetermined number m, controller 20 determines that the erase process is abnormal and performs the erase process and the erase verify process again. The number of retries of the erase process is predetermined.

Note that controller 20 can be configured by a computer including a processor, memory, and other circuits in terms of hardware, and can be realized by a program loaded into memory in terms of software.

As described above, in the non-volatile memory system according to the present embodiment, controller 20 determines whether or not error correction is possible for the address determined as a fail in the erase verify process. That is, it is possible to shorten the erase time and suppress excessive stress on normal cells due to repeated erase processes by determining whether or not error correction is possible without repeating the erase process.

Also, in the non-volatile memory system according to the present embodiment, controller 20 counts the number of addresses determined to be error-correctable, and if the number of such addresses is less than or equal to a predetermined number, it determines that the erase process is normal. That is, only when the cause of the fail determination in the erase verify process is due to abnormal cells, the number of error-correctable addresses is limited to allow error correction. Therefore, error correction for normal cells whose on-current does not reach the threshold level of erase verify is suppressed, and data retention margin can be secured.

<Non-Volatile Memory Rewrite Control Method>

Figure 2:
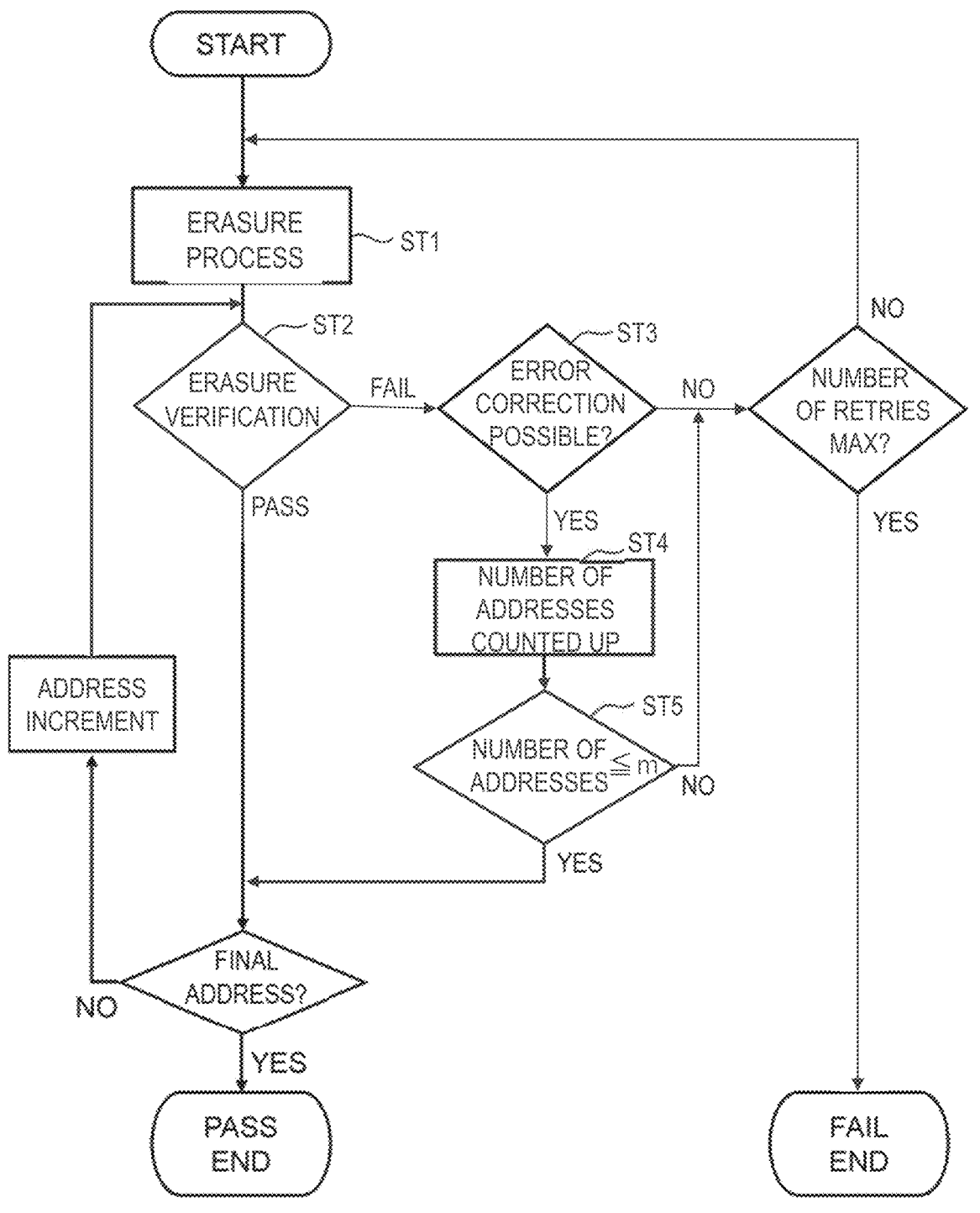
FIG. 2 is a flowchart showing a method for controlling the rewriting of non-volatile memory according to the first embodiment.

Next, referring to FIG. 2, a description will be given of a non-volatile memory rewrite control method according to a first embodiment. FIG. 2 is a flowchart showing a non-volatile memory rewrite control method according to the first embodiment. FIG. 2 shows a control method for the erase process and the erase verify process. In explaining FIG. 2, reference will be made to FIG. 1 as appropriate.

First, as shown in FIG. 2, controller 20 performs an erase process on non-volatile memory 10 (step ST1). The erasure process (step ST1) is performed collectively on a block or multiple blocks composed of multiple addresses. For example, if the non-volatile memory 10 is a flash memory, in the erasure process (step ST1), all data cells of the erasure target address in the non-volatile memory 10 are turned on, and the value of all data cells is set to "1".

Next, as shown in FIG. 2, the controller 20 executes an erasure verification process that determines whether the erasure process (step ST1) passes or fails for each address (step ST2). For example, the controller 20 reads data from the non-volatile memory 10 that has performed the erasure process, and determines whether the value of all data cells for each address is "1".

If the value of all data cells is "1", the controller 20 determines that the erasure verification process passes (step ST2 passes). In this case, as shown in FIG. 2, if the target address is not the final address, it transitions to the next address, returns to step ST2, and performs the erasure verification process for the next address. If the target address is the final address, since the erasure process for all addresses is normal, the controller 20 determines that the erasure process is ultimately normal and ends the erasure process (pass end).

On the other hand, if the value of all data cells is not "1" and the value of the data cell includes "0", the controller 20 determines that the erasure verification process fails (step ST2 fails). In this case, as shown in FIG. 2, it is determined whether error correction is possible (step ST3).

As shown in FIG. 2, if it is determined that error correction is not possible (step ST3 NO), if the number of retries of the erasure process is not the maximum, return to step ST1 and perform the erasure process again. If the number of retries of the erasure process is the maximum, the controller 20 determines that the erasure process is ultimately abnormal and ends the erasure process (fail end). The fail end means that a failure has occurred in the non-volatile memory 10.

On the other hand, as shown in FIG. 2, if it is determined that error correction is possible (step ST3 YES), the number of addresses is counted up (step ST4). That is, the number of addresses determined to be error-correctable in step ST3 is counted.

Next, as shown in FIG. 2, it is determined whether the number of addresses counted in step ST4 is equal to or less than a predetermined number m (step ST5). If the number of addresses is equal to or less than the predetermined number m (step ST5 YES), if the target address is not the final address, transition to the next address, return to step ST2, and perform the erasure verification process for the next address. If the target address is the final address, the controller 20 determines that the erasure process is ultimately normal and ends the erasure process (pass end).

On the other hand, if the number of addresses exceeds the predetermined number m (step ST5 NO), if the number of retries of the erasure process is not the maximum, return to step ST1 and perform the erasure process again. If the number of retries of the erasure process is the maximum, the controller 20 determines that the erasure process is ultimately abnormal and ends the erasure process (fail end).

<Non-Volatile Memory Rewriting Control Method According to the First Comparative Example>

Figure 3:
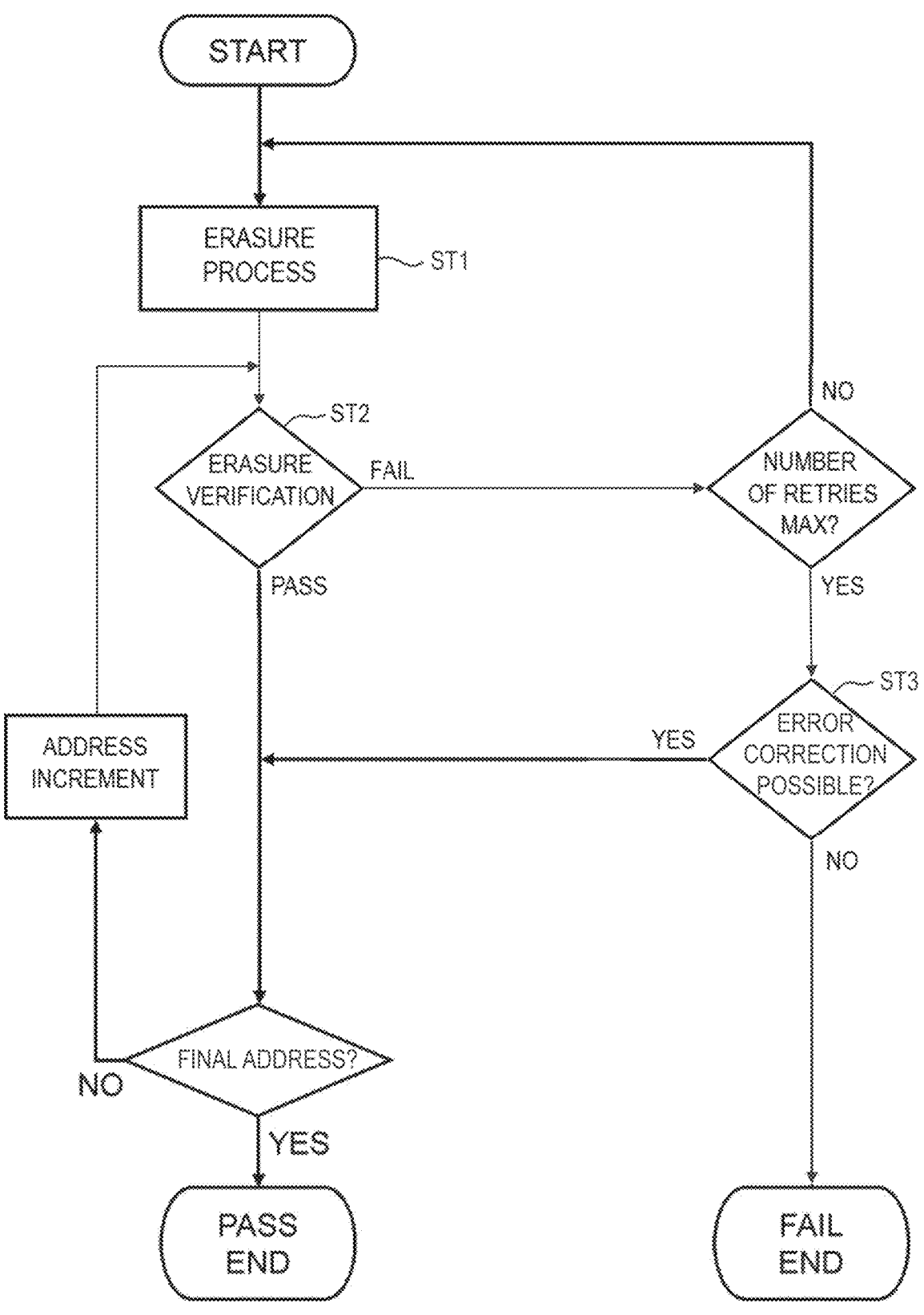
FIG. 3 is a flowchart showing a method for controlling the rewriting non-volatile memory according to a first comparative example.

Here, referring to FIG. 3, the non-volatile memory rewriting control method according to the first comparative example will be described. FIG. 3 is a flowchart showing a non-volatile memory rewriting control method according to the first comparative example. The erasure process (step ST1) and the erasure verification process (step ST2) are common with FIG. 2, so the description will be omitted.

As shown in FIG. 3, in the case of a pass judgment in the erase verify process (pass at step ST2), if the target address is not the final address, the process moves to the next address and returns to step ST2, and performs the erase verify process for the next address. If the target address is the final address, since the erase process for all addresses is normal, the controller 20 determines that the erase process is ultimately normal and ends the erase process (pass end).

On the other hand, as shown in FIG. 3, in the case of a fail judgment in the erase verify process (fail at step ST2), if the number of retries of the erase process is not the maximum value, the process returns to step ST1 and performs the erase process again. If the number of retries of the erase process is the maximum value, it is determined whether error correction is possible (step ST3).

As shown in FIG. 3, if it is determined that error correction is possible (YES at step ST3), if the target address is not the final address, the process moves to the next address and returns to step ST2, and performs the erase verify process for the next address. If the target address is the final address, since the erase process for all addresses is normal, the controller 20 determines that the erase process is ultimately normal and ends the erase process (pass end).

On the other hand, as shown in FIG. 3, if it is determined that error correction is not possible (NO at step ST3), the controller 20 determines that the erase process is ultimately abnormal and ends the erase process (fail end).

<Problems in the Rewrite Control Method of Non-Volatile Memory According to the First Comparative Example>

Figure 4:
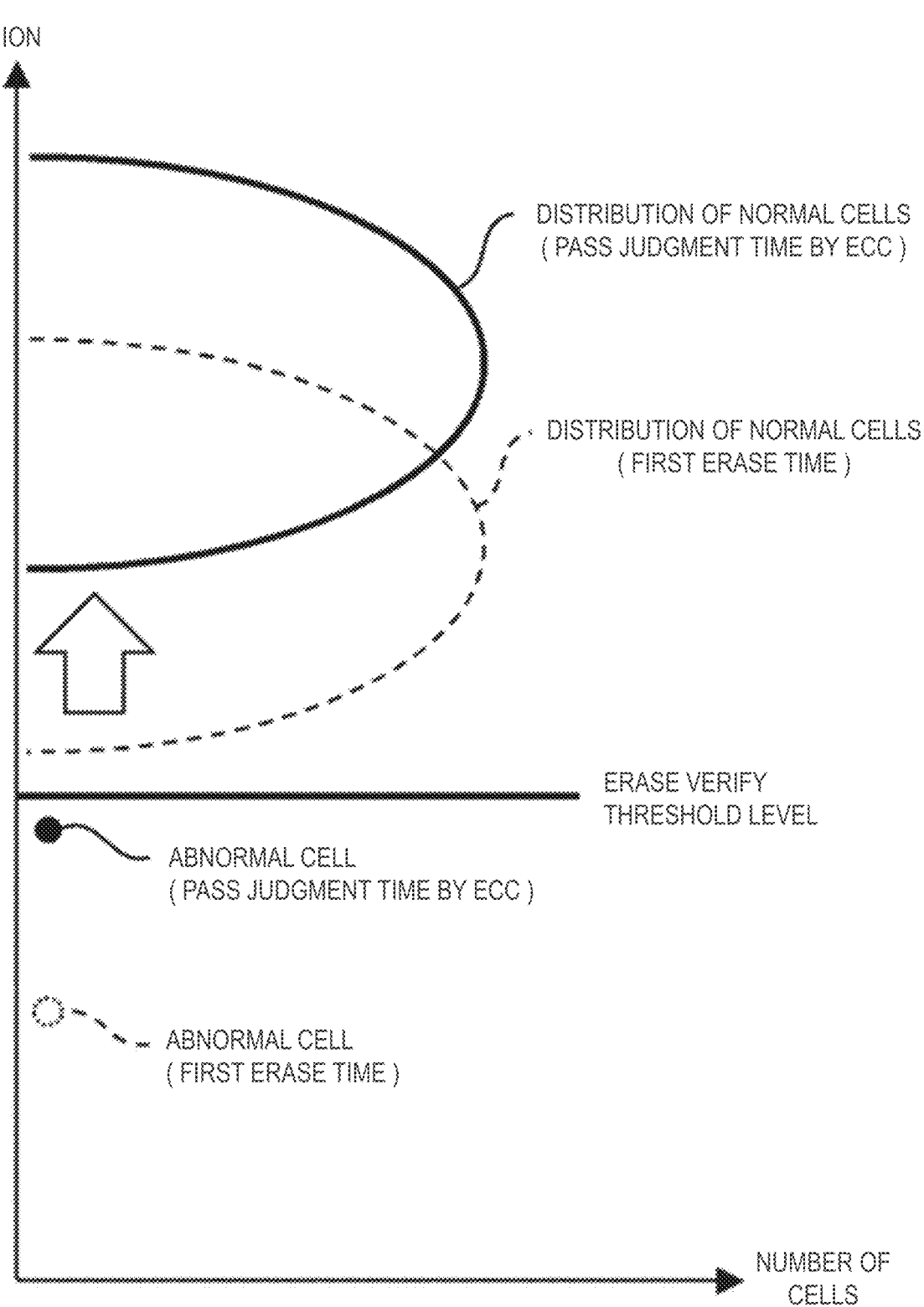
FIG. 4 is a graph for explaining problems in the method for controlling the rewriting of non-volatile memory according to the first comparative example.

Next, referring to FIG. 4, the problems in the rewrite control method of non-volatile memory according to the first comparative example will be explained. FIG. 4 is a graph for explaining the problems in the rewrite control method of non-volatile memory according to the first comparative example. The horizontal axis of FIG. 4 represents the number of cells, and the vertical axis represents the on-current Ion of the cells.

FIG. 4 shows a case where there is an abnormal cell with a small on-current Ion that deviates from the distribution of normal cells. In the example shown in FIG. 4, since the abnormal cell does not exceed the threshold level of the erase verify, it is judged as a fail in the erase verify process shown in FIG. 3 (fail at step ST2), and the erase process (step ST1) is repeated up to the maximum number of retries.

Therefore, in the rewrite control method of non-volatile memory according to the first comparative example, the erase time increases until the pass judgment by error correction. Also, as shown in FIG. 4, until the pass judgment by error correction, the distribution of normal cells excessively shifts to the side where the on-current Ion increases. Therefore, in the rewrite control method of non-volatile memory according to the first comparative example, there was a problem that excessive stress is applied to the normal cells.

<Rewrite Control Method of Non-Volatile Memory According to the Second Comparative Example>

Figure 5:
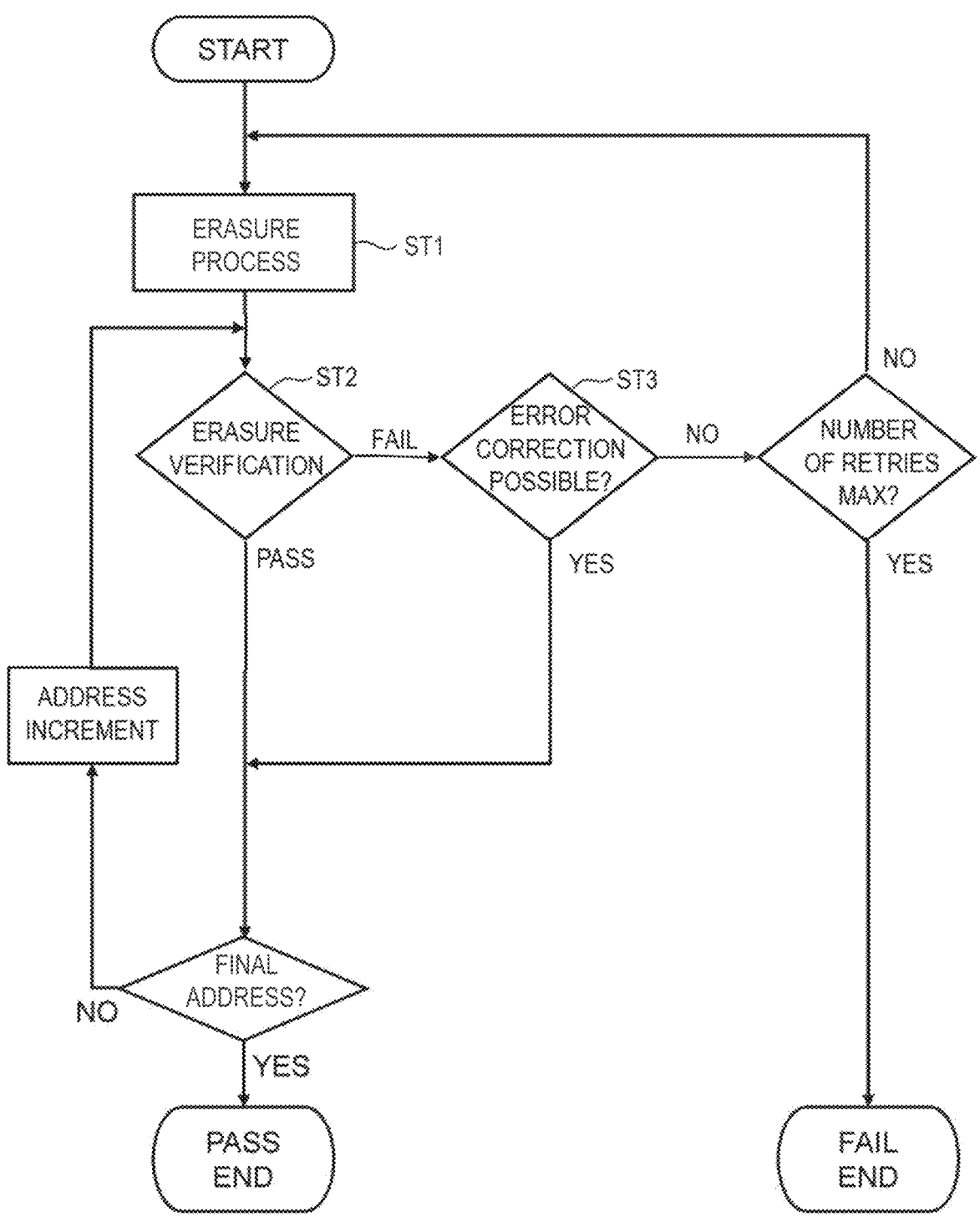
FIG. 5 is a flowchart showing a method for controlling the rewriting of non-volatile memory according to a second comparative example.

Next, referring to FIG. 5, the rewrite control method of non-volatile memory according to the second comparative example will be explained. FIG. 5 is a flowchart showing the rewrite control method of non-volatile memory according to the second comparative example. The erase process (step ST1) and the erase verify process (step ST2) are common with FIG. 2, so the explanation is omitted.

As shown in FIG. 5, in the case of a pass judgment in the erase verify process (pass at step ST2), if the target address is not the final address, the process moves to the next address and returns to step ST2, and performs the erase verify process for the next address. If the target address is the final address, since the erase process for all addresses is normal, the controller 20 determines that the erase process is ultimately normal and ends the erase process (pass end).

On the other hand, as shown in FIG. 5, in the case of a fail determination in the erase verify process (fail at step ST2), it is immediately determined whether error correction is possible (step ST3). As shown in FIG. 5, if it is determined that error correction is possible (YES at step ST3), if the target address is not the final address, the process moves to the next address and returns to step ST2, and the erase verify process is performed for the next address. If the target address is the final address, since the erase process for all addresses is normal, the controller 20 determines that the erase process is ultimately normal and ends the erase process (pass end).

On the other hand, as shown in FIG. 5, if it is determined that error correction is not possible (NO at step ST3), if the number of retries of the erase process is not the maximum, the process returns to step ST1 and the erase process is performed again. If the number of retries of the erase process is the maximum, the controller 20 determines that the erase process is ultimately abnormal and ends the erase process (fail end).

<Problems in the Rewrite Control Method of Non-Volatile Memory According to the Second Comparative Example>

Figure 6:
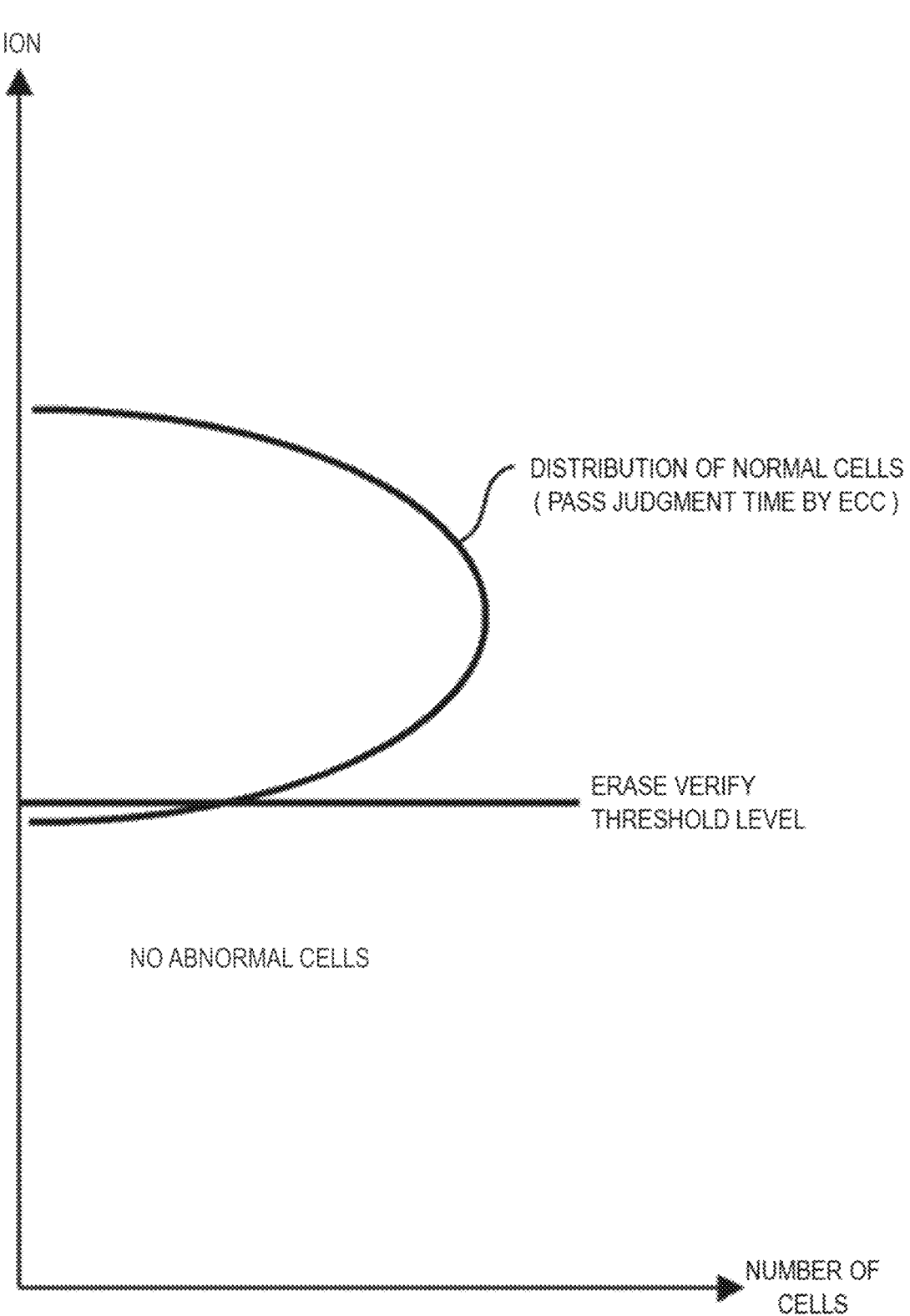
FIG. 6 is a graph for explaining problems in the method for controlling the rewriting of non-volatile memory according to the second comparative example.

Next, referring to FIG. 6, the problems in the rewrite control method of non-volatile memory according to the second comparative example will be explained. FIG. 6 is a graph for explaining the problems in the rewrite control method of non-volatile memory according to the second comparative example. The horizontal axis of FIG. 6 represents the number of cells, and the vertical axis represents the on-current Ion of the cells.

FIG. 6 shows a case where there are no abnormal cells and the on-current Ion of the normal cell distribution is low. In the example shown in FIG. 6, normal cells whose on-current Ion does not reach the threshold level of erase verify cause a fail determination in the erase verify process shown in FIG. 5 (fail at step ST2), but can be immediately determined as error correctable in the subsequent step ST3.

That is, in the rewrite control method of non-volatile memory according to the second comparative example, as shown in FIG. 6, there is a possibility that not only abnormal cells but also normal cells whose on-current Ion does not reach the threshold level of erase verify may be allowed by error correction. In that case, there was a problem that the data retention margin was insufficient and the data retention time, that is, the life was shortened.

<Effect of Non-Volatile Memory Rewrite Control Method>

Next, referring to FIG. 7, the effect of the non-volatile memory rewrite control method according to the first embodiment will be explained.

Figure 7:
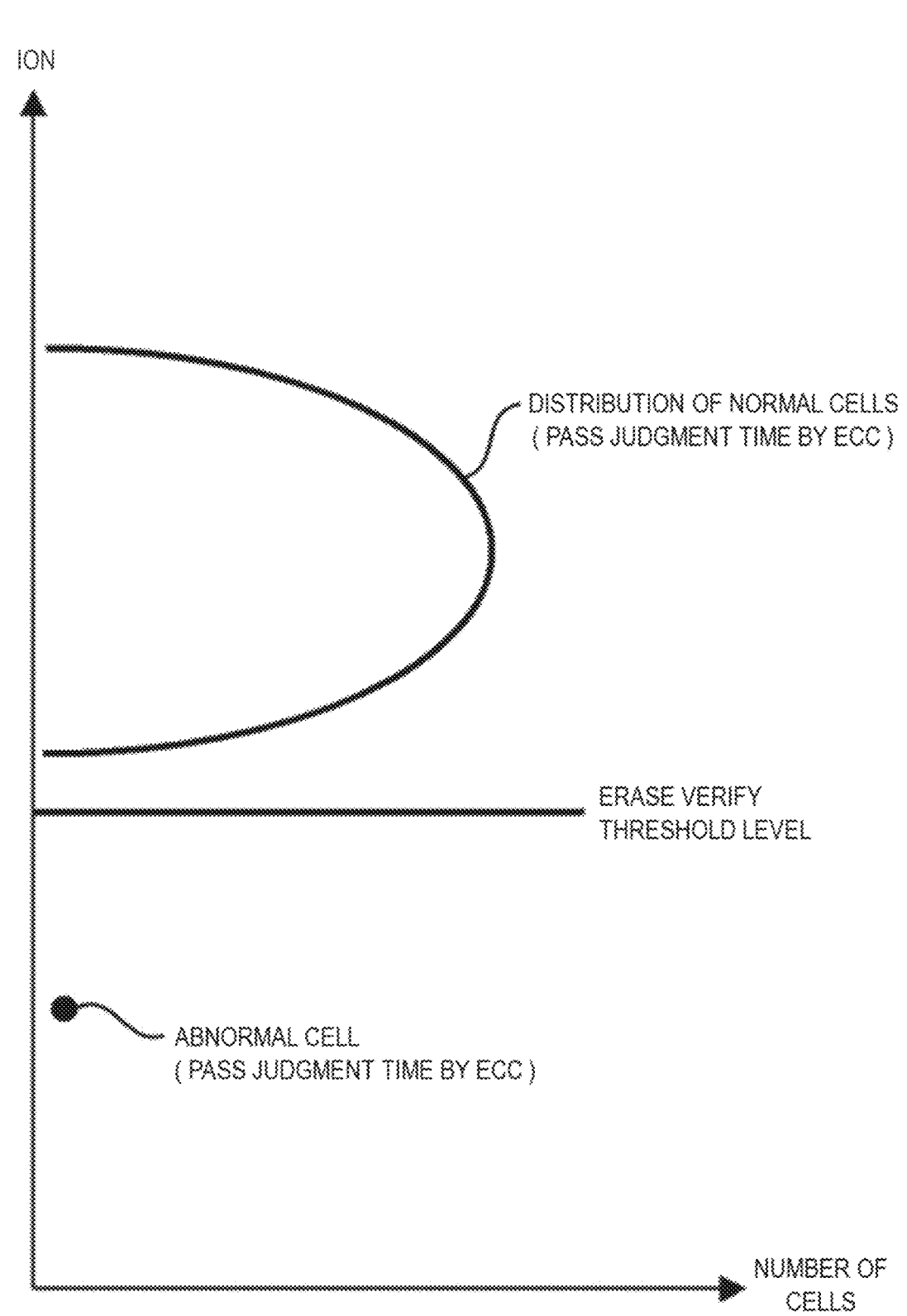
FIG. 7 is a graph for explaining the effects of the method for controlling the rewriting of non-volatile memory according to the first embodiment.

FIG. 7 is a graph for explaining the effect of the non-volatile memory rewrite control method according to the first embodiment. The horizontal axis of FIG. 7 represents the number of cells, and the vertical axis represents the on-current Ion of the cells.

FIG. 7, like FIG. 4, shows a case where there are abnormal cells with small on-current Ion deviating from the distribution of normal cells.

In the example shown in FIG. 7, the abnormal cells do not exceed the threshold level of the erase verify, resulting in a fail determination in the erase verify process shown in FIG. 2 (fail at step ST2), but it is immediately determined to be correctable in the subsequent step ST3.

Therefore, in the non-volatile memory rewrite control method according to the first embodiment, it is possible to shorten the erase time by determining whether it is correctable without repeating the erase process. Also, as can be seen from the comparison between FIG. 4 and FIG. 7, it is possible to suppress excessive stress on normal cells due to the repetition of the erase process.

On the other hand, as shown in FIG. 2, the number of correctable addresses is counted (step ST4), and the number of such addresses is limited to m or less (step ST5). That is, the number of correctable addresses is limited so that only when the cause of the fail determination in the erase verify process is due to abnormal cells, it is allowed by error correction. Therefore, as can be seen from the comparison between FIG. 6 and FIG. 7, the tolerance due to error correction for normal cells that do not meet the threshold level of the erase verify on-current is suppressed, and the data retention margin can also be secured.

Second Embodiment

<Non-Volatile Memory Rewrite Control Method>

Figure 8:
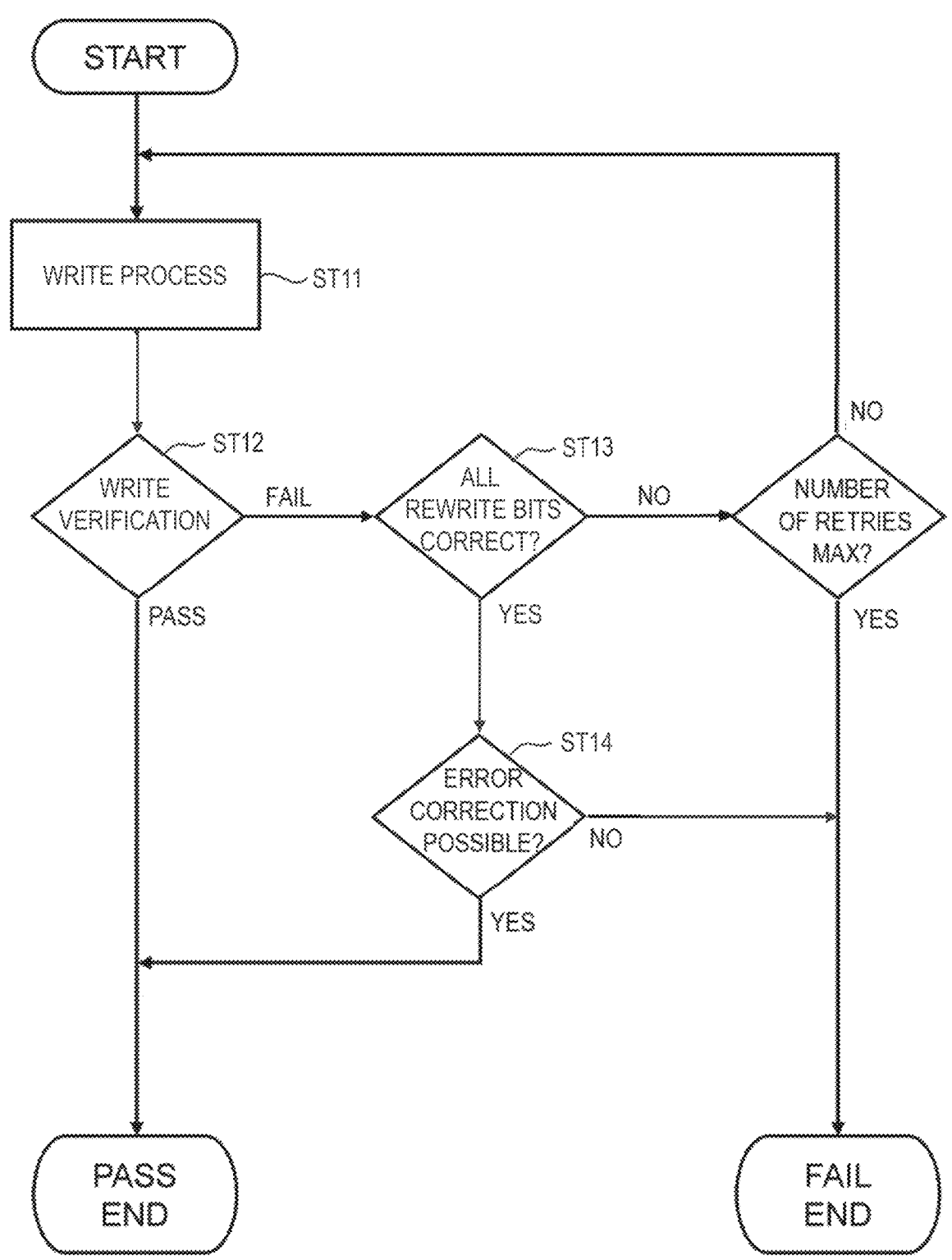
FIG. 8 is a flowchart showing a method for controlling the rewriting of non-volatile memory according to a second embodiment.

Next, referring to FIG. 8, the non-volatile memory rewrite control method according to the second embodiment will be explained. FIG. 8 is a flowchart showing the non-volatile memory rewrite control method according to the second embodiment. FIG. 8 shows the control method of the write process and the write verify process.

The write process and write verify process shown in FIG. 8 are executed after the pass end in the erase process and erase verify process shown in FIG. 2. The configuration of the non-volatile memory system according to the second embodiment is shown in FIG. 1, as in the first embodiment. Therefore, when explaining FIG. 8, refer to FIG. 1 as appropriate.

First, as shown in FIG. 8, the controller 20 executes a write process to the non-volatile memory 10 (step ST11). For example, if the non-volatile memory 10 is a flash memory, in the erase process executed before the write process, all data cells are turned on, and all data cell values are set to "1". Then, in the write process shown in FIG. 8 (step ST11), based on the write data, the predetermined data cells are switched from on to off, and the value of the data cell is switched from "1" to "0".

Next, as shown in FIG. 8, the controller 20 executes a write verify process to determine whether the write process (step ST11) is a pass or fail (step ST12). For example, the controller 20 reads data from the non-volatile memory 10 to which the write process has been executed, and determines whether all data cell values match the write data values.

If all data cell values match the write data values, the controller 20 determines that the write verify process is a pass (pass at step ST12). In this case, as shown in FIG. 8, the controller 20 determines that the write process is ultimately normal and ends the write process (pass end).

On the other hand, if the value of the data cell includes a value that does not match the value of the write data, the controller 20 determines a failure in the write verification process (failure at step ST12). In this case, as shown in FIG. 8, it is determined whether the value of the cell (referred to as "rewrite bit") that can be rewritten from "1" to "0" matches the value "0" of the write data (step ST13).

As shown in FIG. 8, if the value of the rewrite bit includes a value that does not match the value of the write data (NO at step ST13), and if the number of retries of the write process is not at its maximum, it returns to step ST11 and executes the write process again. If the number of retries of the write process is at its maximum, the controller 20 determines that the write process is ultimately abnormal and ends the write process (fail end).

On the other hand, as shown in FIG. 8, if all the values of the rewrite bits match the value of the write data and are correct (YES at step ST13), it is determined whether error correction is possible (step ST14).

Here, if it is determined that error correction is possible (YES at step ST14), the controller 20 determines that the write process is ultimately normal and ends the write process (pass end). On the other hand, as shown in FIG. 8, if it is determined that error correction is not possible (NO at step ST14), the controller 20 determines that the write process is ultimately abnormal and ends the write process (fail end).

Figure 9:
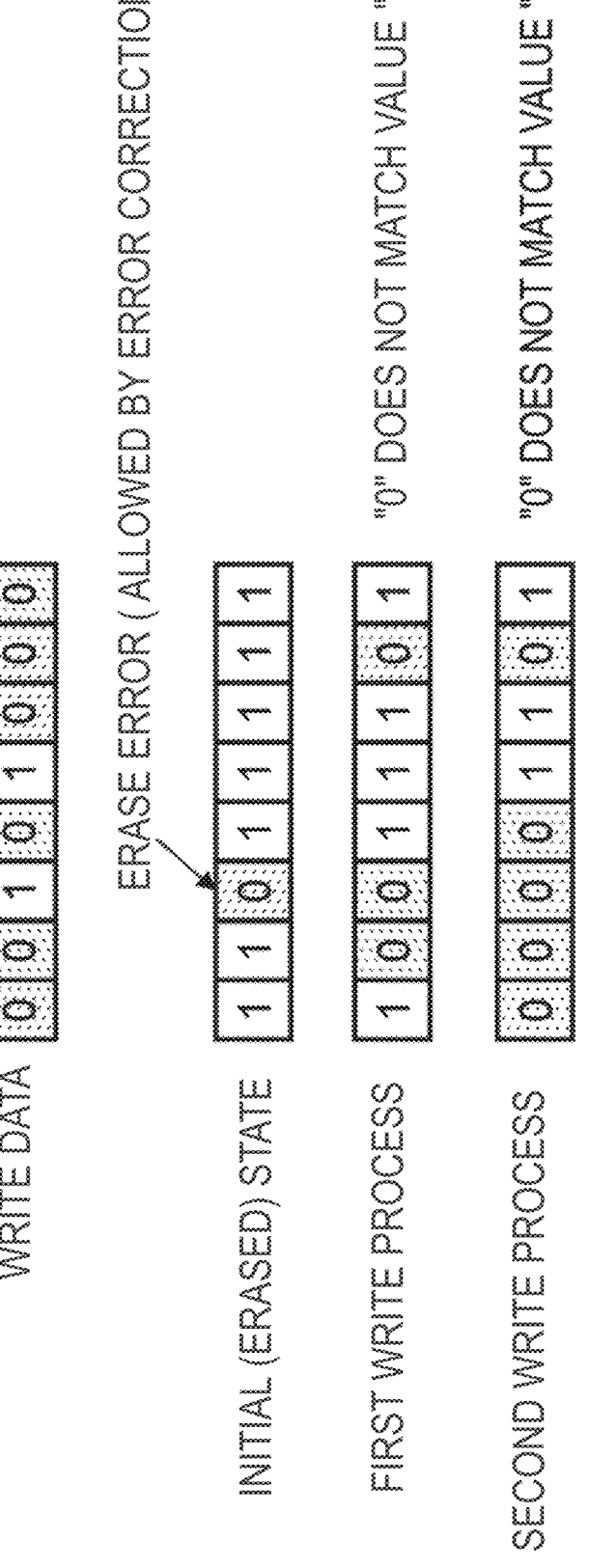
FIG. 9 is a diagram schematically showing the transition of data written into a data cell by the writing process shown in FIG. 8.

Here, FIG. 9 is a diagram schematically showing the transition of data written into the data cell by the write process shown in FIG. 8. The values of each data cell of the write data are shown at the top of FIG. 9, and the values of each data cell in the initial (erased) state are shown in the second row. Furthermore, the values of each data cell after the first write process are shown in the third row of FIG. 9, the values after the second write process are shown in the fourth row, and the values after the third write process are shown at the bottom.

As shown in the second row of FIG. 9, the value of the third data cell from the left in the drawing is "0", which is an erase error, but it is allowed by the error correction in the erase verification process according to the first embodiment.

The value "10011101" after the first write process shown in the third row of FIG. 9 does not match the value "00101000" of the write data shown at the top of FIG. 9, so it is determined as a failure in the write verification process shown in FIG. 8 (failure at step ST12). Furthermore, because the value of the rewrite bit that should be "0" does not match the value "0" of the rewrite bit in the write data (NO at step ST13), it returns to step ST11 and executes the write process again.

The value "00001101" after the second write process shown in the fourth row of FIG. 9 does not match the value "00101000" of the write data shown at the top of FIG. 9, so it is determined as a failure in the write verification process shown in FIG. 8 (failure at step ST12). Furthermore, because the value of the rewrite bit that should be "0" does not match the value "0" of the rewrite bit in the write data (NO at step ST13), it returns to step ST11 and executes the write process again.

The value "00001000" after the third write process shown at the bottom of FIG. 9 does not match the value "00101000" of the write data shown at the top of FIG. 9, so it is determined as a failure in the write verification process shown in FIG. 8 (failure at step ST12). On the other hand, because the value of the rewrite bit that should be "0" matches the value "0" of the rewrite bit in the write data (YES at step ST13), it is determined whether error correction is possible (step ST14). Here, since the error bit is only one bit of erase error, error correction is possible (YES at step ST14). Therefore, the write process is ultimately determined to be normal.

Herein, an erasure process and an erasure verification process according to the first embodiment shown in FIG. 2 are tolerating erasure errors. Therefore, in the writing process and the writing verification process according to the present embodiment shown in FIG. 8, only erasure errors in the initial (erased) state are tolerated, and errors in the rewritten bits in the writing process are not tolerated. The other configurations are the same as the first embodiment, so the explanation is omitted.

In the above example, the program includes a group of instructions (or software code) that, when loaded into a computer, cause the computer to perform one or more functions described in the embodiment. The program may be stored in a non-transitory computer-readable medium or a tangible memory medium. Non-limiting examples of the computer-readable medium or tangible memory medium include RAM (Random-Access Memory), ROM (Read-Only Memory), flash memory, SSD (Solid-State Drive) or other memory technologies, CD-ROM, DVD (Digital Versatile Disc), Blu-ray (registered trademark) disc or other optical disc storage, magnetic cassette, magnetic tape, magnetic disk storage or other magnetic storage devices. The program may be transmitted on a temporary computer-readable medium or communication medium. Non-limiting examples of the temporary computer-readable medium or communication medium include electrical, optical, acoustic, or other forms of propagation signals.

The invention made by the present inventor has been specifically described based on the embodiments, but the present invention is not limited to the embodiments already mentioned, and it goes without saying that various changes can be made within the scope not departing from the gist thereof.

What is claimed is:

1. A non-volatile memory system comprising:
   a non-volatile memory including a data cell and an error correction code cell corresponding to each address; and
   a controller circuit configured to perform bulk erasing process for multiple addresses of the non-volatile memory and perform a verifying process that determines whether the erasing process passes or fails for each address,
   wherein the controller circuit determines availability of an error correction for addresses determined to fail in the verifying process, counts a number of addresses determined that the error correction is available, and determines that the erasing process is normal when the number of the addresses which is available to the error correction is equal to or less than a predetermined number.

2. The non-volatile memory system according to claim 1, wherein, when the number of addresses exceeds the predetermined number, the controller circuit determines the erasing process is abnormal and reperforms the erasing process.

3. The non-volatile memory system according to claim 2, wherein a number of reperforming of the erasing process when a previous erasing process is determined to be abnormal is predetermined.

4. The non-volatile memory system according to claim 1, wherein the controller circuit further performs a writing process for the non-volatile memory on which the erasing process has been performed and a write verifying process that determines whether the writing process passes or fails,
   wherein, when it is determined that the write verifying process fails, the controller circuit determines whether all values of bits rewritable from an erased state are correct,
   wherein, when all the values of the bits are correct, the controller circuit determines whether the error correction is available, and
   wherein the error correction is determined to available, the controller circuit determines the writing process is normal.

5. The non-volatile memory system according to claim 4, wherein, when the values of the bits are not correct, the controller circuit determines that the writing process is abnormal and reperforms the writing process and the write verifying process.

6. The non-volatile memory system according to claim 4, wherein, when it is determined that the error correction is not available, the controller circuit determines that the writing process is ultimately abnormal.

7. A non-volatile memory rewrite control method, comprising:

(a) performing a bulk erasing process for multiple addresses of a non-volatile memory including a data cell and an error correction code cell for each address;

(b) performing an erase verifying process that determines whether the erasing process passes or fails for each address;

(c) determining, for addresses determined to fail in the erase verifying process, whether error correction is available;

(d) counting a number of addresses determined to be the error correction is available; and (e) determining, when the number of addresses which the error correction is available is equal to or less than a predetermined number, that the erasing process is normal.

8. The non-volatile memory rewrite control method according to claim 7, wherein, when the number of addresses exceeds the predetermined number, the erasing process is determined to be abnormal and the erasing process is reperformed.

9. The non-volatile memory rewrite control method according to claim 8, wherein a number of reperforming of the erasing process when a previous erasing process is determined to be abnormal is predetermined.

10. The non-volatile memory rewrite control method according to claim 7, further comprising:

performing a writing process for the non-volatile memory on which the erasing process has been performed and a write verifying process that determines whether the writing process passes or fails, when it is determined that the write verifying process fails, determining whether all values of bits rewritable from an erased state are correct, when all the values of the bits are correct, determining whether the error correction is available, and when the error correction is determined to be possible, determining that the writing process is normal.

11. The non-volatile memory rewrite control method according to claim 10, further comprising, when the values of the bits are incorrect, determining that the writing process is abnormal, and reperforming the writing process and the write verifying process.

12. The non-volatile memory rewrite control method according to claim 10, further comprising, when it is determined that the error correction is not available, ultimately determining that the writing process is abnormal.

\* \* \* \* \*